(12) United States Patent
Park

(10) Patent No.: US 9,812,593 B2
(45) Date of Patent: Nov. 7, 2017

(54) SOLAR CELL AND PREPARING METHOD OF THE SAME

(71) Applicant: LG INNOTEK CO., LTD., Seoul (KR)

(72) Inventor: Gi Gon Park, Seoul (KR)

(73) Assignee: LG INNOTEK CO., LTD, Seoul (KR)

(*) Notice: Subject to any disclaimer, the term of this patent is extended or adjusted under 35 U.S.C. 154(b) by 148 days.

(21) Appl. No.: 14/356,087

(22) PCT Filed: Oct. 31, 2012

(86) PCT No.: PCT/KR2012/009023
§ 371 (c)(1),
(2) Date: May 2, 2014

(87) PCT Pub. No.: WO2013/066030
PCT Pub. Date: May 10, 2013

(65) Prior Publication Data
US 2014/0305505 A1    Oct. 16, 2014

(30) Foreign Application Priority Data

Nov. 2, 2011    (KR) .................. 10-2011-0113292

(51) Int. Cl.
*H01L 31/0328* (2006.01)
*H01L 31/0216* (2014.01)
(Continued)

(52) U.S. Cl.
CPC ............ *H01L 31/02167* (2013.01); *H01L 31/022425* (2013.01); *H01L 31/046* (2014.12);
(Continued)

(58) Field of Classification Search
None
See application file for complete search history.

(56) References Cited

U.S. PATENT DOCUMENTS

2005/0217722 A1   10/2005   Komatsu et al.
2007/0079866 A1    4/2007   Borden et al.
(Continued)

FOREIGN PATENT DOCUMENTS

CN       101496273 A     7/2009
CN       101764168 A     6/2010
(Continued)

OTHER PUBLICATIONS

Duchatelet et al. Effect of Oxydation Pre-Treatment on Mo to Control the Growth and Formation of MoSe2 Layers for CIGS solar cells. 25th European Photovoltaic Solar Energy Conference and Exhibition/5th World Conference on Photovoltaic Energy Conversion, Sep. 6-10, 2010, Valencia Spain, pp. 3379-3381.*

(Continued)

*Primary Examiner* — Jayne Mershon
(74) *Attorney, Agent, or Firm* — Saliwanchik, Lloyd & Eisenschenk

(57) ABSTRACT

Disclosed are a solar cell and preparing method of the same. The solar cell includes a back electrode layer on a support substrate, a molybdenum oxide layer on the back electrode layer, a light absorbing layer on the molybdenum oxide layer, and a front electrode layer on the light absorbing layer.

15 Claims, 2 Drawing Sheets

(51) Int. Cl.
  *H01L 31/0224* (2006.01)
  *H01L 31/0749* (2012.01)
  *H01L 31/046* (2014.01)
  *H01L 31/0465* (2014.01)

(52) U.S. Cl.
  CPC ...... *H01L 31/0465* (2014.12); *H01L 31/0749* (2013.01); *Y02E 10/541* (2013.01)

(56) References Cited

U.S. PATENT DOCUMENTS

| | | | |
|---|---|---|---|
| 2007/0163646 A1* | 7/2007 | Kushiya | H01L 31/022425 136/264 |
| 2010/0269907 A1* | 10/2010 | Lackner | C22C 27/04 136/264 |
| 2010/0282300 A1* | 11/2010 | Auvray | H01L 31/022425 136/252 |
| 2012/0103416 A1 | 5/2012 | Kwon et al. | |

FOREIGN PATENT DOCUMENTS

| | | |
|---|---|---|
| CN | 101821855 A | 9/2010 |
| CN | 101918604 A | 12/2010 |
| KR | 10-2011-0045181 A | 5/2011 |
| KR | 10-2011-0048731 A | 5/2011 |
| KR | 10-2011-0049971 A | 5/2011 |

OTHER PUBLICATIONS

Yoon et al., Characterization of efficiency-limiting resistance losses in monolithically integrated Cu(In,Ga)Se2 solar modules, Scientific Reports, pp. 1-9 (2015). [Evidentiary support for resistance properties of ZnO].*
Office Action dated Sep. 1, 2015 in Chinese Application No. 201280064565.5.
International Search Report in International Application No. PCT/KR2012/009023, filed Oct. 31, 2012.
Office Action dated Mar. 17, 2016 in Chinese Application No. 2016031401316520.

* cited by examiner

[Fig. 1]
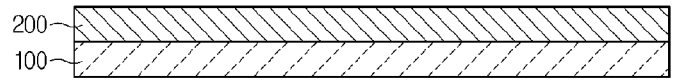
[Fig. 2]
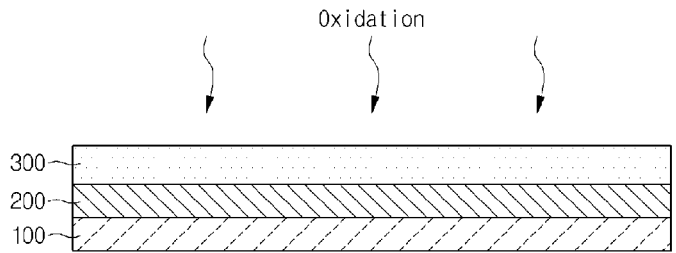
[Fig. 3]
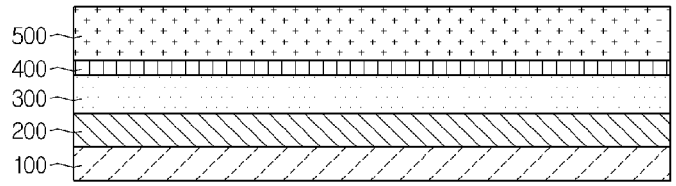
[Fig. 4]
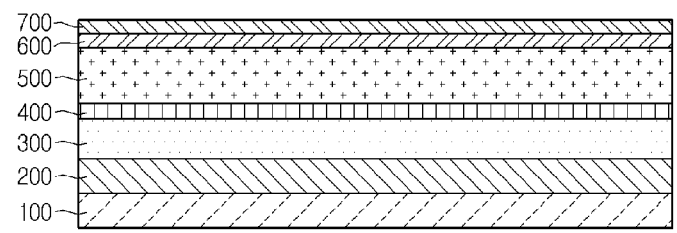
[Fig. 5]
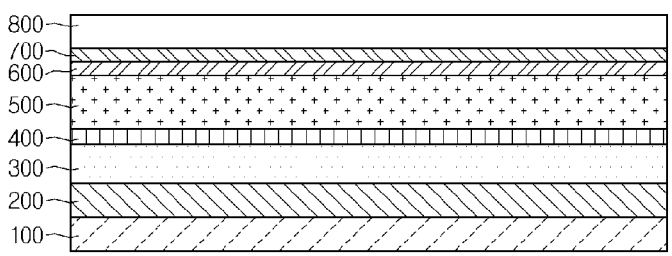
[Fig. 6]
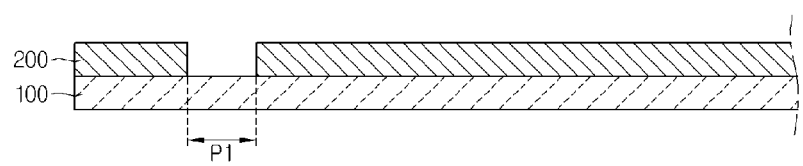
[Fig. 7]
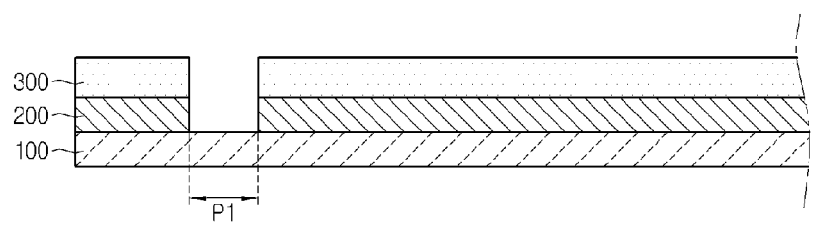

[Fig. 8]
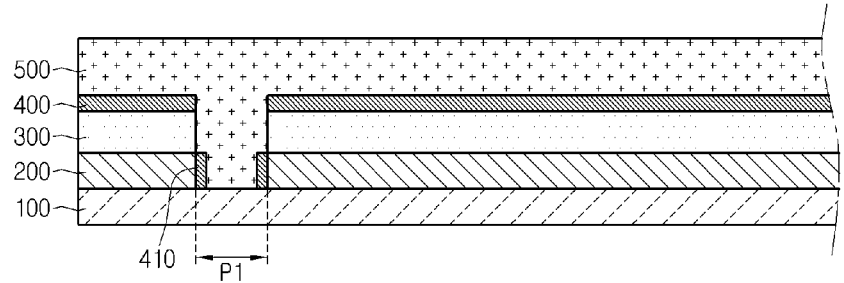
[Fig. 9]
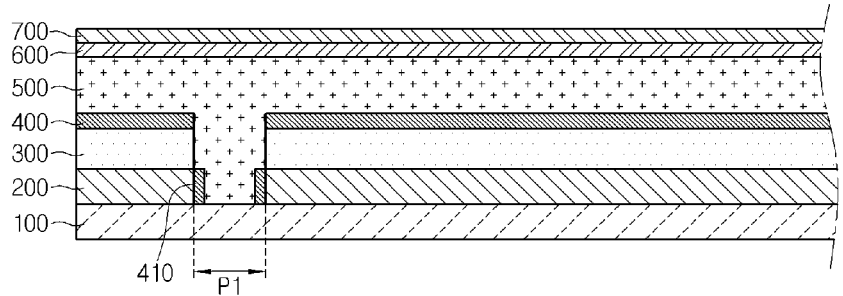
[Fig. 10]
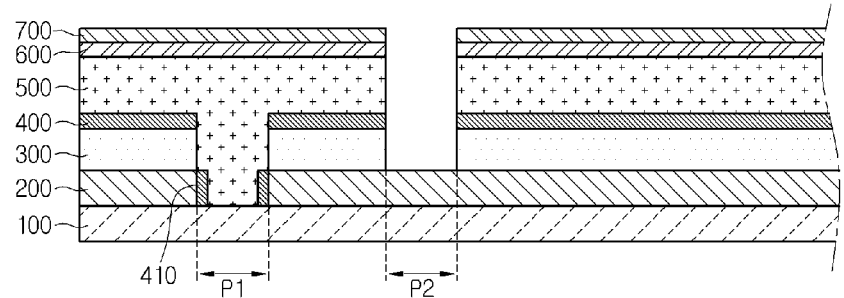
[Fig. 11]
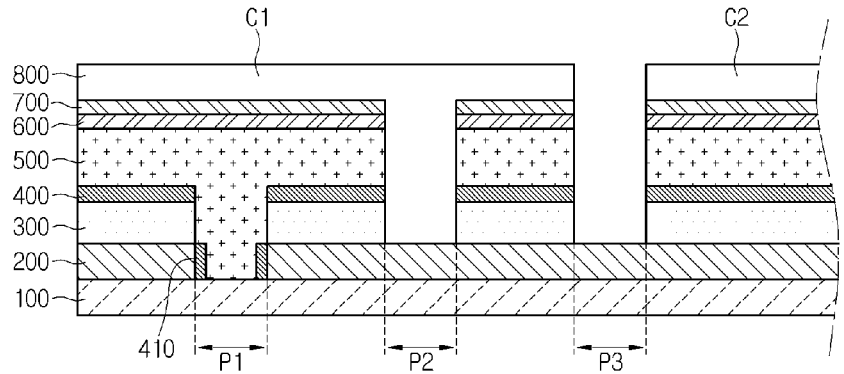

SOLAR CELL AND PREPARING METHOD OF THE SAME

CROSS-REFERENCE TO RELATED APPLICATIONS

This application is the U.S. national stage application of International Patent Application No. PCT/KR2012/009023, filed Oct. 31, 2012, which claims priority to Korean Application No. 10-2011-0113292, filed Nov. 2, 2011, the disclosures of each of which are incorporated herein by reference in their entirety.

TECHNICAL FIELD

The embodiment relates to a solar cell and a method of preparing the same.

BACKGROUND ART

Recently, the requirement for new renewable energy and the interest of the new renewable energy have been more increased due to the serious environmental pollution and the lack of fossil fuel. In this regard, a solar cell is spotlighted as a pollution-free energy source for solving the future energy problem because it rarely causes environmental pollution and has the semi-permanent life span and there exists infinite resources for the solar cell.

Solar cells may be defined as devices for converting light energy into electric energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chalcopyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

A CIGS thin film solar cell is fabricated by sequentially forming a substrate including sodium (Na), a back electrode layer, a light absorbing layer, and a thin film of a window layer. As described above, the light absorbing layer includes CIGS compound. When the CIGS compound is formed on the back electrode layer, a molybdenum selenide ($MoSe_2$) layer is formed between the back electrode layer and the light absorbing layer.

The $MoSe_2$ layer increases adhesive strength at the interfacial surface between the back electrode layer and the light absorbing layer, but has resistance higher than that of the back electrode layer to increase contact resistance between the window layer and the back electrode layer so that overall efficiency of a solar cell is significantly reduced.

DISCLOSURE OF INVENTION

Technical Problem

The embodiment provides a solar cell capable of representing improved photoelectric conversion efficiency by reducing series resistance $R_S$.

Solution to Problem

According to the first embodiment, there is provided a solar cell including: a back electrode layer on a support substrate; a molybdenum oxide layer on the back electrode layer; a light absorbing layer on the molybdenum oxide layer; and a front electrode layer on the light absorbing layer.

According to the second embodiment, there is provided a solar cell including: a back electrode layer on a support substrate, a perforating hole partially exposing a top surface of the support substrate being formed through the back electrode layer; a current blocking part on at least one side of the back electrode layer exposed through the perforating hole; a molybdenum oxide layer on the back electrode layer; a light absorbing layer on the molybdenum oxide layer; and a front electrode layer on the light absorbing layer.

According to the embodiment, there is provided a method of preparing a solar cell, including: forming a back electrode layer on a support substrate, a perforating hole partially exposing a top surface of the support substrate being formed through the back electrode layer; forming a molybdenum oxide layer on a top surface of the back electrode layer; forming a light absorbing layer on the molybdenum oxide layer; and forming a front electrode layer on the light absorbing layer.

Advantageous Effects of Invention

According to the solar cell of the embodiment, a molybdenum oxide layer having a superior reactivity as compared with that of a contact resistance layer is formed so that generation of the contact resistance can be minimized. Accordingly, the increase of the series resistance $R_S$ caused by the contact resistance layer can be prevented and photoelectric conversion efficiency of the solar cell can be improved.

BRIEF DESCRIPTION OF DRAWINGS

FIGS. 1 to 5 are sectional views showing a method of fabrication a solar cell according to the first embodiment; and FIGS. 6 to 11 are sectional views showing a method of fabrication a solar cell according to the second embodiment.

MODE FOR THE INVENTION

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIGS. 1 to 5 are sectional views showing a method of fabrication a solar cell according to the first embodiment.

Referring to FIG. 1, a back electrode layer 200 is formed on a support substrate 100. The back electrode layer 200 may be formed through a PVD (Physical Vapor Deposition) scheme or a plating scheme.

The support substrate 100 has a plate shape and supports the back electrode layer 200, a molybdenum oxide layer 300, a contact resistance layer 400, a light absorbing layer 500, a buffer layer 600, a high-resistance buffer layer 700, and a front electrode layer 800. The support substrate 100 may be transparent, and may be rigid or flexible.

The support substrate 100 may include an insulator. For example, the support substrate 100 may include a glass substrate, a plastic substrate, or a metallic substrate. In more detail, the support substrate 100 may include a soda lime glass substrate. In addition, the support substrate 100 may include a ceramic substrate including alumina, stainless steel, or polymer having a flexible property.

The back electrode layer 200 is provided on the support substrate 100. The back electrode layer 200 is a conductive layer. The back electrode layer 200 may include one selected from the group consisting of molybdenum (Mo), gold (Au), aluminum (Al), chrome (Cr), tungsten (W), and copper (Cu). The back electrode layer 200 may include the Mo. The Mo has a thermal expansion coefficient similar to that of the support substrate 100, so the Mo may improve the adhesive property and prevent the back electrode layer 200 from being delaminated from the substrate 100.

Referring to FIGS. 2 and 3, the light absorbing layer 500 is formed on the molybdenum oxide layer 300.

The light absorbing layer 500 may be formed through various schemes such as a scheme of forming a Cu(In,Ga)Se$_2$ (CIGS) based light absorbing layer 500 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, or a Ga target. Thereafter, the metallic precursor layer is subject to the selenization process so that the Cu (In, Ga)Se$_2$ (CIGS) based light absorbing layer 500 is formed.

In addition, the sputtering process employing the Cu target, the In target, and the Ga target and the selenization process may be simultaneously performed.

Further, a CIS or a CIG based light absorbing layer 500 may be formed through the sputtering process employing only Cu and In targets or only Cu and Ga targets and the selenization process.

The contact resistance layer 400 may be simultaneously formed together with the light absorbing layer 500. In detail, the contact resistance layer 400 may be formed by mutual reaction between the back electrode layer 200 and the light absorbing layer 500. For example, the back electrode layer 200 may include Mo and the light absorbing layer 500 may include Cu (In, Ga) Se$_2$ (GIGS) based compound or Cu—In/Ga—S based compound. In this case, the contact resistance layer 400 may be fabricated by reaction between the Mo of the back electrode layer 200 and the Se or the S of the light absorbing layer 500. Accordingly, the contact resistance layer 400 may include molybdenum selenide (MoSe$_2$) or molybdenum sulfide (MoS$_2$). A thickness of the contact resistance layer 400 may be in the range of about 10 nm to about 40 nm, but the embodiment is not limited thereto.

The contact resistance layer 400 has resistance higher than that of the back electrode layer 200. Accordingly, if the contact resistance layer 400 becomes thicker, contact resistance and series resistance R$_S$ are increased, resulting in reduction of overall efficiency of the solar cell.

To solve the above mentioned problem, in the embodiment, the molybdenum oxide layer 300 is formed on the back electrode layer 200. The molybdenum oxide layer 300 includes oxide but a conductive material, has resistance lower than that of the contact resistance layer 400 so that the series resistance R$_S$ of the solar cell may be lowered.

The molybdenum oxide layer 300 may be partially or fully formed on a top surface of the back electrode layer 200.

In detail, the molybdenum oxide layer 300 may be formed between the back electrode layer 200 and the light absorbing layer 500.

The molybdenum oxide layer 300 may include MoO$_2$ or MoO$_3$. Bond energy between the Mo and oxygen (O) constituting the molybdenum oxide layer 300 is greater than bond energy between the Mo and the Se or between the Mo and the S. Accordingly, the molybdenum oxide layer 300 interrupts the bonding between the Mo and the Se for constituting the contact resistance layer 400, so generation of the contact resistance layer 400 may be minimized.

A thickness of the molybdenum oxide layer 300 may be in the range of about 10 nm to about 50 nm, but the embodiment is not limited thereto. Although the contact resistance layer 400 formed on the molybdenum oxide layer 300 is shown and described in FIG. 3, the embodiment is not limited thereto. That is, when the molybdenum oxide layer 300 is very thick, the contact resistance layer 400 may be omitted. Accordingly, the light absorbing layer 500 may make direct contact with a top surface of the molybdenum oxide layer 300.

The molybdenum oxide layer 300 may be formed by oxidizing the back electrode layer 200. For example, when the back electrode 200 is fabricated by Mo, the molybdenum oxide layer 300 may be fabricated by oxidizing the back electrode layer 200 at a temperature in the range of about 300° C. to about 800° C. in an oxygen atmosphere. In addition, the molybdenum oxide layer 300 may be formed by allowing MoO$_3$ powder to make contact with the back electrode layer 200 and performing a reducing heat-treatment in a hydrogen atmosphere.

Referring to FIG. 4, a buffer layer 600 and a high-resistance buffer layer 700 are sequentially formed on the light absorbing layer 500. The buffer layer 600 may be formed by depositing CdS on the light absorbing layer 500 through a CBD (Chemical Bath Deposition) scheme. For example, the buffer layer 600 may include CdS, ZnS, In$_x$S$_y$, and In$_x$Se$_y$Zn(O, OH), but the embodiment is not limited thereto. The thickness of the buffer layer 600 may be in the range of about 50 nm to about 150 nm, and the energy bandgap of the buffer layer 400 may be in the range of about 2.2 eV to about 2.4 eV.

Zinc oxide is deposited on the buffer layer 600 through a sputtering process, and the high-resistance buffer layer 700 is formed. The high resistance buffer layer 700 may include iZnO which is zinc oxide not doped with impurities. The high resistance buffer layer 700 may have an energy bandgap in the range of about 3.1 eV to about 3.3 eV. In addition, the high resistance buffer layer 700 may be omitted.

Referring to FIG. 5, a front electrode layer 800 is formed by laminating a transparent conductive material on the high-resistance buffer layer 700.

The front electrode layer 800 may have the characteristics of an N-type semiconductor. In this case, the front electrode layer 800 forms an N type semiconductor with the buffer layer 30 to make a PN junction with the light absorbing layer 500 serving as a P type semiconductor layer. For instance, the front electrode layer 800 may include aluminum-doped zinc oxide (AZO) or boron-doped zinc oxide (BZO). The front electrode layer 800 may have a thickness in the range of about 500 nm to about 1000 nm, but the embodiment is not limited thereto.

For instance, the front electrode layer 800 can be formed through the RF sputtering scheme using a ZnO target, the reactive sputtering scheme using a Zn target, and the metal organic vapor deposition process.

FIGS. 6 to 11 are sectional views showing a method of fabrication a solar cell according to the second embodiment.

Referring to FIG. 6, a back electrode layer material is coated on the support substrate 100 and a first perforating hole P1 for separating the back electrode layer material is formed. That is, the back electrode layer 200 includes the first perforating hole P1, and both sides of the back electrode layer 200 may be exposed by the first perforating hole P1. A top surface of the support substrate 100 may be partially exposed by the first perforating hole P1. The back electrode layer 200 may be divided into a plurality of back electrodes through the first perforating hole P1.

Referring to FIG. 7, the molybdenum oxide layer 300 is formed on the back electrode layer 200. When oxidizing a back electrode after making the perforating hole, an oxide layer may be formed on a sidewall of the perforating hole as well as the top surface of the back electrode layer 200.

Referring to FIG. 8, the light absorbing layer 500 is formed on the molybdenum oxide layer 300. The light absorbing layer 500 may be gap-filled in the first perforating hole P1.

When forming the light absorbing layer 500, the contact resistance layer 400 and a current blocking part 410 may be simultaneously provided. The contact resistance layer 400 is formed on a top surface of the molybdenum oxide layer 300, and the current blocking part 410 may be formed at at least one side of the back electrode layer 200 exposed by the first perforating hole P1. In detail, the current blocking part 410 may be provided at both sides of the back electrode layer 200 exposed through the first perforating hole P1. Since the current blocking part 410 may prevent an electric current from flowing between the back electrode layer 200 spaced by the first perforating hole P1 and the light absorbing layer 500300 filling the first perforating holes P1, a leakage current may be reduced.

The current blocking part 410 may include the same material as that of the contact resistance layer 400. For example, the current blocking part 410 may include molybdenum selenide ($MoSe_2$) or molybdenum sulfide ($MoS_2$).

Referring to FIGS. 9 and 10, the buffer layer 600 and the high-resistance buffer layer 700 are sequentially formed on the light absorbing layer 500, and a second perforating hole P2 is formed therethrough. That is, the second perforating hole P2 is formed through the light absorbing layer 500, the buffer layer 600, and the high-resistance buffer layer 700. The second groove P2 may be formed through the mechanical scheme. The second perforating hole P2 has the width in the range of about 80 μm to about 200 μm, but the embodiment is not limited thereto. The back electrode layer 200 is partially exposed by the second perforating hole P2.

Referring to FIGS. 10 and 11, a front electrode layer 800 is formed on the high-resistance buffer layer 700, and the front electrode layer 800 is formed through a third perforating hole P3. The third groove P3 may be formed through the mechanical scheme, and the back electrode layer 200 is partially exposed. The third perforating hole P3 has the width in the range of about 80 μm to about 200 μm, but the embodiment is not limited thereto. The front electrode layer 800 may be divided into a plurality of front electrodes and a plurality of solar cells C1, C2, C3 . . . may be defined by the third perforating holes P3.

According to the solar cell prepared by the foregoing method, a molybdenum oxide layer having a superior reactivity as compared with that of a contact resistance layer is formed so that generation of the contact resistance can be minimized. Accordingly, the increase of the series resistance $R_S$ caused by the contact resistance layer can be prevented and photoelectric conversion efficiency of the solar cell can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate;
   a molybdenum oxide layer on the back electrode layer;
   a contact resistance layer on the molybdenum oxide layer;
   a light absorbing layer on the contact resistance layer;
   a buffer layer on the light absorbing layer;
   a high-resistance buffer layer on the buffer layer;
   a front electrode layer on the light absorbing layer;
   a first perforating hole partially exposing a top surface of the support substrate and formed through the back electrode layer, the molybdenum oxide layer, and the contact resistance layer;
   a second perforating hole partially exposing a top surface of the hack electrode layer and formed through the molybdenum oxide layer, the contact resistance layer, the buffer layer and the high-resistance buffer layer;
   a third perforating hole partially exposing a top surface of the back electrode layer and formed through the molybdenum oxide layer, the contact resistance layer, the buffer layer, the high-resistance buffer layer and the front electrode layer; and
   a current blocking part formed at both sides of the back electrode layer exposed through the first perforating hole;
   wherein the light absorbing layer is filled in the first perforating hole;
   wherein the light absorbing layer is in direct physical contact with a top surface of the support substrate, a top surface of the current blocking part, a lateral surface of the current blocking part, a lateral surface of the molybdenum oxide layer, and a lateral surface of the contact resistance layer in the first perforating hole;
   wherein a side surface of the light absorbing layer has a step difference due to the current blocking part in the first perforating hole;
   wherein the light absorbing layer is physically separated from the back electrode layer by the current blocking part; and wherein a height of the current blocking part corresponds to a thickness of the back electrode layer.

2. The solar cell of claim 1, wherein the thickness of the molybdenum oxide layer is in a range of 10 nm to 50 nm.

3. The solar cell of claim 1, wherein the molybdenum oxide layer comprises $MoO_2$ or $MoO_3$.

4. The solar cell of claim 1, wherein the light absorbing layer comprises one of a Cu—In—Se based compound, a Cu—Ga—Se based compound, a Cu—In—S based compound, and a Cu—Ga—S based compound.

5. The solar cell of claim 1, wherein the molybdenum oxide layer is an oxidized back electrode layer.

6. The solar cell of claim 3, wherein the current blocking part includes molybdenum selenide ($MoSe_2$) or molybdenum sulfide ($MoS_2$).

7. The solar cell of claim 6, wherein the second perforating hole has a width in the range of from about 80 μm to about 200 μm.

8. The solar cell of claim 7, wherein the third perforating hole has a width in the range of from about 80 μm to about 200 μm.

9. The solar cell of claim 2, wherein the thickness of the contact resistance layer is in a range of from 10 nm to 40 nm.

10. The solar cell of claim 1, wherein the thickness of the contact resistance layer is in a range of from 10 nm to 40 nm.

11. The solar cell of claim 6, wherein the current blocking part includes the same material as that of the contact resistance layer.

12. The solar cell of claim 11, wherein the contact resistance layer has a resistance higher than that of the back electrode layer.

13. The solar cell of claim 12, wherein the molybdenum oxide layer has a resistance lower than that of the contact resistance layer.

14. The solar cell of claim 1, wherein the contact resistance layer has a resistance higher than that of the back electrode layer.

15. The solar cell of claim 13, wherein the molybdenum oxide layer has a resistance lower than that of the contact resistance layer.

* * * * *